United States Patent
Motika et al.

[11] Patent Number: 5,942,911
[45] Date of Patent: Aug. 24, 1999

[54] ELECTRIC FIELD TEST OF INTEGRATED CIRCUIT COMPONENT

[75] Inventors: Franco Motika; Paul Motika, both of Hopewell Junction, N.Y.; Phil Nigh, Williston, Vt.

[73] Assignee: International Business Machines Corporation, Armonk, N.Y.

[21] Appl. No.: 09/123,149

[22] Filed: Jul. 27, 1998

Related U.S. Application Data

[62] Division of application No. 08/851,142, May 5, 1997, Pat. No. 5,807,763.

[51] Int. Cl.$^6$ .................................................. G01R 31/26
[52] U.S. Cl. ........................ 324/769; 324/750; 324/754; 324/765
[58] Field of Search ................... 324/750, 754, 324/760, 761, 762, 765, 766, 769

[56] References Cited

U.S. PATENT DOCUMENTS

| | | | |
|---|---|---|---|
| 4,621,233 | 11/1986 | Davari et al. ........................ | 324/765 |
| 5,037,771 | 8/1991 | Lipp ....................................... | 438/200 |
| 5,543,334 | 8/1996 | Yoshii et al. ........................... | 438/17 |
| 5,699,282 | 12/1997 | Allen et al. ............................ | 702/85 |

Primary Examiner—Glenn W. Brown
Attorney, Agent, or Firm—Schmeiser, Olsen & Watts; Richard M. Kotulak

[57] ABSTRACT

The manufacture of an integrated circuit chip includes testing the integrated circuit while an external electric field is applied to the integrated circuit to facilitate detection of open circuit type defects. The electric field may be provided by applying a high potential to a plate parallel to a plane of the integrated circuit or by applying a high potential to a probe and moving the probe across the surface of the integrated circuit chip to obtain information regarding the location of the defect. Use of a probe type electric field generator allows the approximate position of the defect to be determined. The invention enhances current testing and diagnostics methods for wafers, chips, and integrated circuit packages by allowing detection of floating net defects during other conventional tests.

12 Claims, 10 Drawing Sheets

ELECTRIC FIELD TEST OF INTEGRATED CIRCUIT COMPONENT

This application is a divisional of application Ser. No. 08/851,142, now U.S. Pat. No. 5,807,763.

TECHNICAL FIELD

This invention relates to production of integrated circuit components such as computer chips and integrated circuit packages and more specifically to the testing of such integrated circuit components. This invention most closely relates to the field of testing metal oxide silicon (MOS) integrated circuits.

BACKGROUND

Early computers used only discrete (individual) electronic components connected into circuit boards to form computer circuits. Circuit boards may be formed from epoxy cloth filled with fiberglass and partially cured to produce material known throughout the art as prepregs which are mechanically drilled to provide holes through the boards. The board surface and holes may be plated with a thin coating of copper metal (Cu) which is selectively coated with a material resistant to etching; the exposed Cu is etched away while the portion that is protected by the resist forms a wiring pattern over each major surface of the board and form plated through holes (PTHs) extending through the board to interconnect the two wiring layers. In early computers, each diode, transistor, resistor, and capacitor was individually positioned on the circuit board with leads inserted through the PTHs and then soldered in place to form an electronic circuit.

Transistors are devices which control the flow of electricity (current) between two electrical connections. The flow is controlled by regulating the potential (or current depending on the type of device) applied to other connections of the transistor. Generally, wires (called leads) are attached to each connection of the transistor to conduct electrical current or to apply the potential (or current) to the connection. Typically, two or more wires are connected to conduct current through the transistor and one or two wires are connected to control the electrical current through the device.

Transistors are devices manufactured in a highly pure crystal of semiconductive metal (e.g. Silicon, Geranium, Gallium-Arsenide) by multiple steps in which various other metals (e.g. Arsenic, Phosphorus and Boron) are diffused into the crystal at different selected surface locations. In one method called evaporation, the other metals (called impurities or dopants) are diffused into the silicon (Si) by positioning or forming a mask over the Si surface, placing the Si substrate in a very hot vacuum chamber, and heating other metals to their boiling point to provide a metal gas or vapor of the other metals in the chamber. The mask has openings through which the evaporated metal vapors reach the surface of the Si metal and atoms of the other metals slowly move into the Si metal.

In the late 1950's, integrated circuits comprising multiple transistors in a single crystal substrate of Si were developed. To manufacture these integrated circuits, a layer of Silicon dioxide ($SiO_2$) is formed over the surface of the crystal to cover the devices, and cavities are selectively etched through the $SiO_2$ to access the connections of the devices. The devices are interconnected by forming a pattern of metal wires over the $SiO_2$ surface and in the cavities. The wires are produced by forming a mask or positioning a mask over the $SiO_2$ surface in a vacuum chamber and providing a vapor of a metal such as Aluminum (Al) which does not tend to diffuse into the Si crystal and which condenses on the surface at openings in the mask to form wires and form conductive vias in the cavities through the $SiO_2$. Additional wiring layers may be provided by forming dielectric layers with interconnection cavities and depositing additional wiring layers over respective dielectric layers. The completed wiring is covered by a layer of dielectric passivation to protect the wiring layers and Si devices. A multitude of openings in the passivation at respective contacts of the wiring layers allow the integrated circuit to be connected to leads which are connected into a circuit board.

More recently, in order to increase production speeds, sputtering and ion implantation methods have largely replaced metal evaporation for diffusing impurities into Si. Integrated circuits may include as many as 5 wiring layers separated by dielectric layers. The first wiring layer is usually poly-silicon (p-Si) and the subsequently formed wiring layers are usually Al deposited by sputtering or evaporation. Since the 1950's the density of devices and wiring in integrated circuits has vastly increased. Today, millions of transistors fit in a square centimeter, and hundreds of deposited wires can fit through a space no wider than an average human hair. The number of connections has increased from the 3 or 4 leads typical for discrete transistors to more than 500 ball type surface-to-surface connections for some integrated circuits.

Due to the high density of interconnections and to protect the computer chip from environmental hazards, integrated circuit chips are usually packaged in a component containing a very fine line circuitized substrate and leads or terminals to connect the substrate to the circuit board. Contacts on the chip are connected with contacts on the substrate of the package by either wire bonding or flip-chip connection. In wire bonding, very fine wires (1 to 3 mil) are connected between corresponding contacts of the chip and package substrate. In flip-chip connection, an array of bumps on the surface of a flip-chip are soldered to a corresponding array of pads on the package substrate. The most common integrated circuit components are dual in-line packages (DIPs) and single in-line packages (SIPs). These are flat rectangular packages with multiple leads (pins) extending from one or both longer edges of the package, and the leads are spaced to fit into one or two rows of PTHs of the circuit board. Another common type of pin-in-hole component is the pin grid array (PGA) in which pins extend from a major surface of a ceramic or organic substrate into a matrix of PTHs on a circuit board. The pins of such pin-in-hole packages may be connected to the PTHs by dipping the board into a wave of molten solder.

More recently components have been connected onto an array of pads on a surface of the circuit board in a process called surface mounting. Common types of surface mount components include quad flat packs (QFPs) and thin small outline packages (TSOPs). These packages include a thin, square or rectangular package substrate with leads extending outward from each edge of the package substrate and down onto the array of pads on the circuit board which leads have a J or gull-wing shape.

Other newer types of surface mount components include ball grid array (BGA) modules and column grid array (CGA) modules in which a matrix of balls or columns extend from one side of the package for surface-to-surface connection with a corresponding matrix of pads on the circuit board surface. The package substrates of BGA and CGA modules may include a tape of flexible layers of polyimid and patterned Cu foil, an organic substrate or a ceramic substrate. Surface mount modules or packages may be connected to metal pads on the surface of the circuit board by screening a paste containing solder particles (solder paste) onto the pads, placing the component on the circuit board surface with surface mount leads on the paste, heating the circuit board to melt the metal particles to form molten solder connecting between the leads and pads.

Testing of integrated circuits is one of the most critical steps in the manufacture of computers. If the circuits are not thoroughly tested then defective circuits could be used to make expensive products which may subsequently fail. Some defects may even lead to failure of other components of computer systems. Thus testing is one of the most important steps in the production of integrated circuits. In early computer systems, the testing of circuits that included only discrete components was simpler because the leads of each component were available for testing. In integrated circuits the semiconductor devices are not directly accessible. The devices are covered with multiple wiring layers and multiple dielectric layers and the wiring layers are covered with passivation. Thus, only a relatively small number of leads may be accessible for testing millions of devices. Complex integrated circuits sometimes include special circuits to facilitate testing other portions of the integrated circuit.

In critical computer systems integrated circuits are exposed to functional testing which may include burn-in to eliminate any early failure type defects. The functional testing is intended to simulate field operation conditions, but for complex circuits it is not possible to simulate every potential operating condition.

The entire disclosure of the above citations are hereby incorporated in whole by reference.

SUMMARY OF THE INVENTION

In a first invention of Applicants a planar substrate of semiconductor material is formed, then electronic devices are formed in the substrate at a first surface of the substrate. Then one or more wiring layers are formed over the first surface with the wiring layers separated by dielectric layers with conductive vias through the dielectric layers for electrical interconnection between the wiring layers and to the electronic devices. The wiring layers include contacts for connecting leads to the wiring layers and/or for testing the integrated circuit.

An electric field is externally applied to at least a portion of the wiring layers of the integrated circuit. Test patterns are applied to the integrated circuit through a multitude of test probes positioned on contacts of the wiring layers while test data are collected through another multitude of test probes from other contacts of the wiring layers. The electric field is generated by applying a relatively high potential to a probe or plate that is electrically isolated from the electronic circuit. The potential applied to the plate is preferably much higher than any potential applied to the integrated circuit by the test patterns. The potential applied to the plate may be fluctuated. The fluctuations may be square wave, or other wave function or preferably may depend on the test generated test patterns. The fluctuations of the potential of the plate or probe dynamically fluctuate the externally applied electric field to optimize detectability of open circuit type defects in the integrated circuit. The test results are collected and compared with an expected result or an expected range of results to determine if there are any open circuit or floating network type defects in the network. The expected results may be generated by applying the test signal patterns without any externally applied electric field.

Alternatively, when no other testing is being performed, one or more high impedance test probe may be positioned on contacts including at least one contact connected to a wiring network of the wiring layers, and the network extends into the portion of the wiring layers exposed to the electric field. The potential of the network at the contact is determined and compared with an expected result or an expected range of results to determine if there are any open circuit or floating network type defects in the network.

In a first aspect of the first invention the electric field may be applied by positioning a fixed plate extending over a significant portion of one side of the integrated circuit and applying a potential to the fixed plate. This method will result in an electric field approximately perpendicular to the plane of the substrate over at least a significant portion of the integrated circuit. The fixed plate may be positioned over a first surface of the substrate to test the integrated circuit of a computer chip or one of the integrated circuits of a wafer.

Alternatively, the fixed plate may be positioned over a second surface of the substrate to allow simultaneous testing of a multitude of integrated circuits on a wafer before it is diced into individual computer chips or to test a flip-chip connected into a test stand.

In a second aspect of the first invention the electric field is applied by moving a high potential probe in a predetermined pattern over one side of the integrated circuit. The electric field may be applied to either the first surface or the second surface of the integrated circuit substrate. The end of the probe may have a insignificant area such as a pointed probe or may have a significant area such as a small plate.

In a second invention of Applicants a substrate of dielectric material is produced and holes are formed through the dielectric substrate. Then the dielectric substrate and holes are coated with electrically conductive metal. The metal coating is patterned to provide on at least one surface of the substrate, a wiring layer including contacts for connecting an integrated circuit chip to the substrate surface. Alternatively, the metal may be applied through a mask in a pattern on the substrate. The wiring layer is covered with a dielectric layer including windows at the contacts to form an interconnect substrate.

An integrated circuit chip is then produced with an integrated circuit including contacts on a first surface for connection with the substrate surface. The integrated circuit chip is positioned on the substrate surface at the contacts, and the contacts of the integrated circuit chip are then connected to a corresponding multitude of the contacts of the interconnect substrate.

The chip carrier substrate may be a flexible tape substrate or a rigid organic substrate or a ceramic substrate. The chip may be mounted with the first surface facing away from the carrier substrate, then interconnected to the substrate with bond wires, and tested by applying the electrical field to the first surface of the chip. Alternatively, the chip may be positioned with the first surface toward the package substrate, then connected with flip-chip solder bumps, and the external electric field applied to the second surface of the chip.

An electric field is externally applied to at least a portion of the integrated circuit chip while potentials are measured using one or more probes positioned on respective contacts. The contacts are electrically interconnected to a wiring network of the integrated circuit chip, whose network extends into the portion of the chip exposed to the electric field. Afterwards, the potentials are compared to expected results to determine if there are any open circuit or floating network type defects in the network. The expected results are preferably generated by conventional testing of the integrated package without the electric field and then compared with test results generated when performing the conventional testing when the electric field is applied to the integrated circuit.

Other alternatives and advantages of Applicant's inventions will be disclosed or become obvious to those skilled in the art by studying the following detailed description with reference to the following drawings.

DETAILED DESCRIPTION OF THE DRAWINGS

Figure 1:
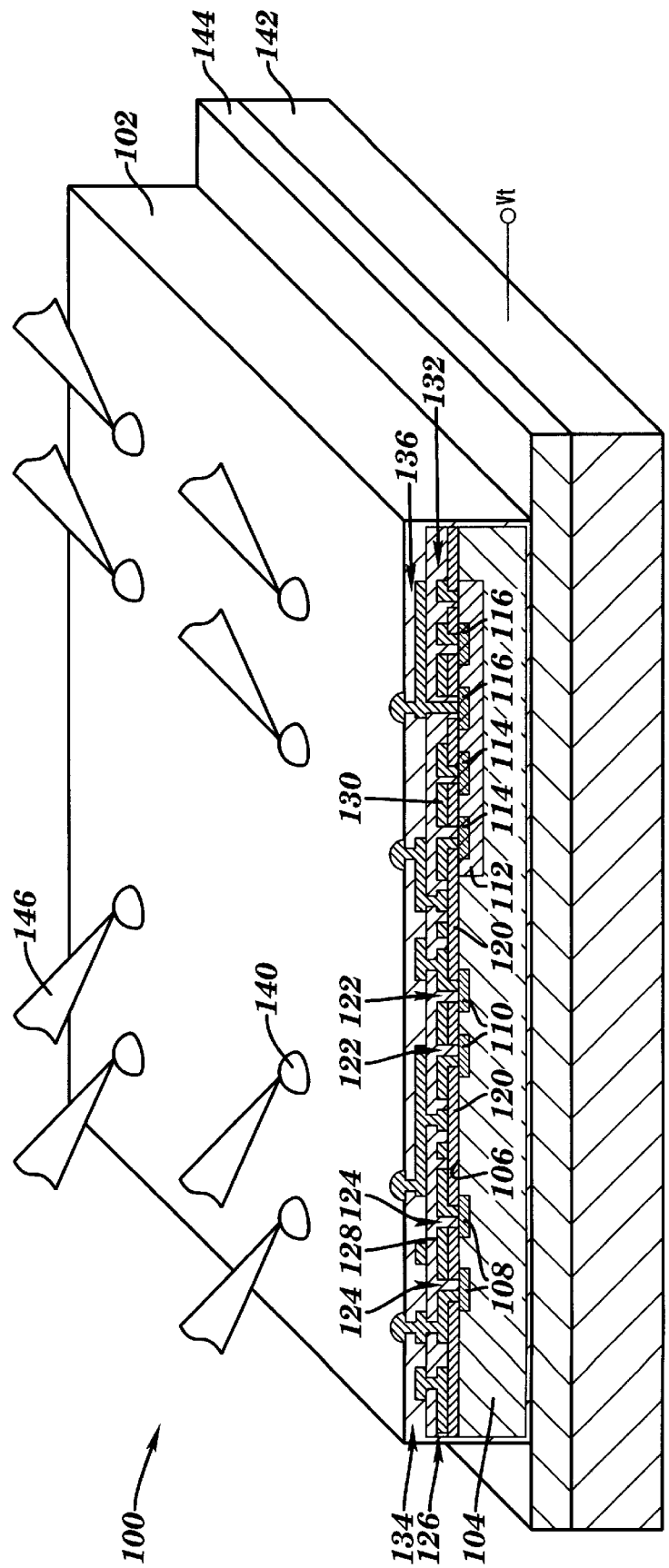
FIG. 1 is an oblique partial section showing an integrated circuit and a portion of the test system of the invention.

FIG. 1 shows a portion of a first embodiment 100 of the test apparatus of the invention including integrated circuit chip 102 produced by the process of the invention which includes testing the integrated circuit while an external electric field is applied to the integrated circuit. In the production of computer chip 102, semiconductor substrate 104 is produced by slicing a wafer from a single cylindrical crystal of highly pure semiconductor metal such as silicon. The silicon crystal may be produced by either the Czochralski or float-zone processes. Preferably the substrate is silicon containing a relatively small concentration of Boron to form an N-type semiconductor substrate. Larger concentrations of a second metal such as Arsenic or Phosphorus are selectively introduced through openings in a mask (stencil or developed photo-resist coating) at surface 106 to form regions of P-type semiconductor at 108, 110 to form contacts for a NMOSFET transistors, and at 112 to form a P-type well. Then relatively much larger concentrations of a metal such as Boron are diffused into regions 114 and 116 to form contacts for PMOSFET transistors.

A first dielectric layer is provided over surface 106 such as layer 120 of $SiO_2$ which may be formed by chemical vapor deposition (CVD) or by exposing surface 106 to oxygen and/or steam. A mask (not shown) is provided over the $SiO_2$ layer and cavities such as at 122 and 124 are etched through the $SiO_2$ to the contacts 108, 110, 114, and 116. Then the mask is removed. A first wiring layer 126 of conductive metal is formed over the $SiO_2$ layer. Preferably the wiring layer is formed by providing a mask and using evaporation to form wires of N-type polysilicon (multi-crystal silicon). The first wiring layer includes gates such as at 128 and 130 for controlling current through the MOSFET transistors. Second dielectric layer 132 is formed over the first wiring layer. The second dielectric layer may be formed by spin coating with polyimide and curing or by CVD of $SiO_2$, silicon nitride ($Si_3N_4$), glass or an organic polymer. Cavities are formed through the second dielectric layer by providing a mask and etching such as dry etching with oxygen plasma or wet etching and then removing the mask. Second wiring layer 134 may be formed by providing a mask and condensing Al vapor to form wires and to fill the cavities formed through the dielectric. Additional dielectric and wiring layers similar to 132 and 134 may be provided as required by the circuit design. The chip is covered with a layer of dielectric passivation 136 to cover the wiring layers and protect the chip from the external environment. The passivation may be glass, polyimide, or another highly dielectric material. A mask is formed over the passivation and cavities are etched through the passivation for connection to the wiring layers of the integrated circuit. Pads or bumps 140 (as shown) may be provided over the passivation layer at the cavities, or the cavities may be made larger to expose pads of the wiring layers.

An electric field source such as a probe 142 (or plate as shown) is positioned near to the integrated circuit. The source of the electric field is electrically isolated from the integrated circuit by the layer of passivation 136 and/or by a dielectric layer 144 coating the plate. Plate 142 is connected to a source of high potential labeled Vt, and probes 146 which may have a high impedance, are connected to the pads or bumps 140. Preferably, the potential Vt is fluctuated to change the electric field while the potential at the contacts is measured to identify any unusual changes due to open type defects.

Figure 2:
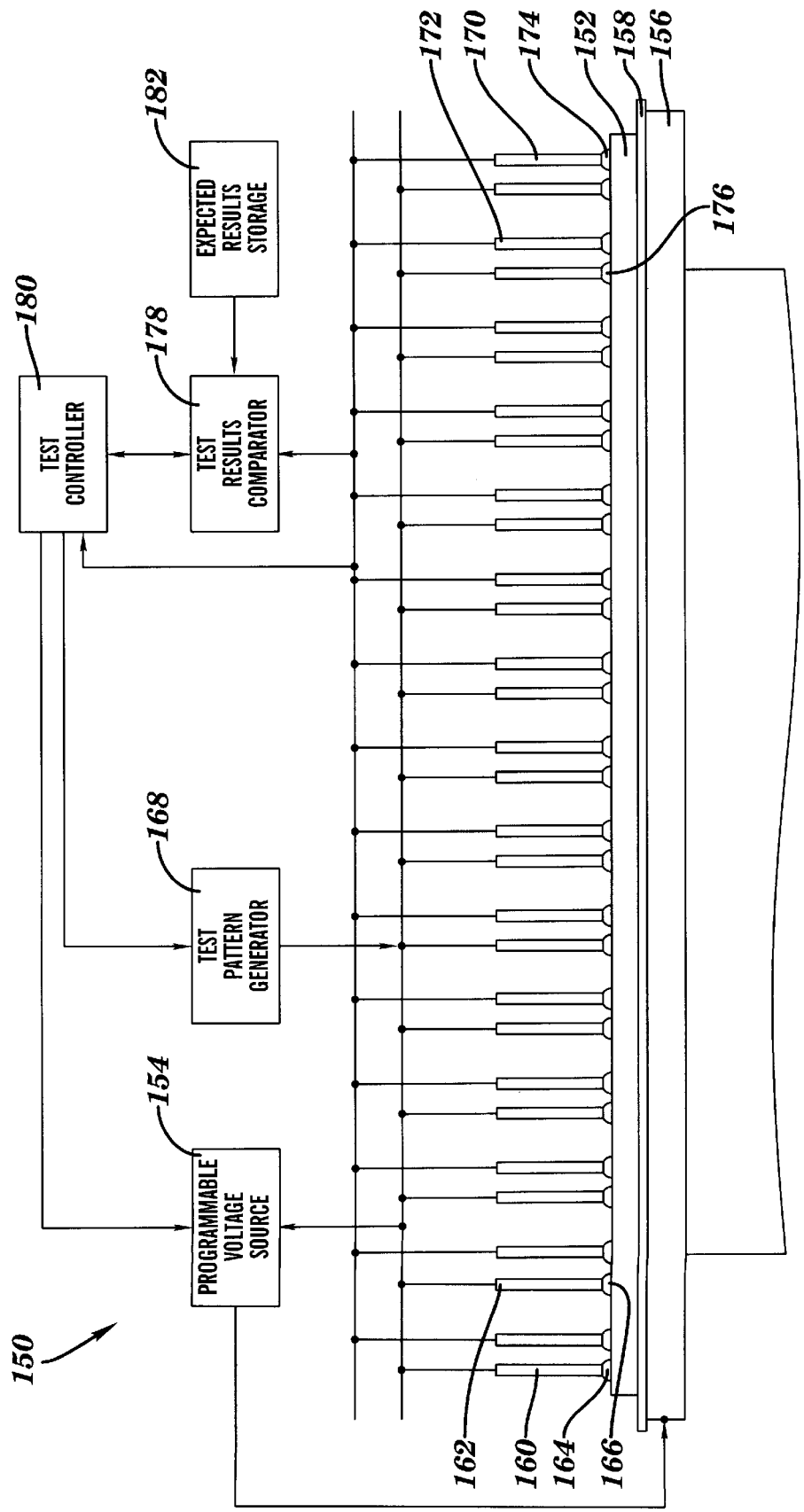
FIG. 2 schematically illustrates another embodiment of the tester of the invention with the test plate on one side and collapsible column type probes connected to the other side of a wafer with multiple integrated circuits.

FIG. 2 shows a second embodiment 150 of the test apparatus invention of Applicants in which a multitude of individual integrated circuits of a semiconductor wafer 152 is tested while an external electrical field is applied to the wafer. The external electrical field is generated by applying a potential regulated by programmable voltage source 154, to test chuck 156. The chuck is electrically isolated from the wafer by dielectric layer 158. A first multitude of buckling beam type test probes such as probes 160 and 162 are positioned on respective contacts 164 and 166 and connected to a test pattern generator 168 to apply a functional and/or other type of conventional electronic test signals to the integrated circuits of the wafer. A second multitude of buckling beam type test probes such probes 170 and 172 are positioned on respective contacts 174 and 176 to collect test result data of the conventional testing. The data are then transmitted to test results comparator 178 and the test controller 180. The test comparator is connected to an expected test results storage 182 to compare the test results with expected test results. The expected test results may be collected during an earlier conventional test in which the chuck 156 is at a low potential to minimize generation of electrical fields. Depending on the comparison, the comparator signals test controller 180 which regulates the testing process and responds to discovery of possible defects. The potential of the chuck 156 may be regulated by the programmable voltage source depending on the signals generated by the test pattern generator to enhance the detectability of floating net type defects in the integrated circuits.

Figure 3:
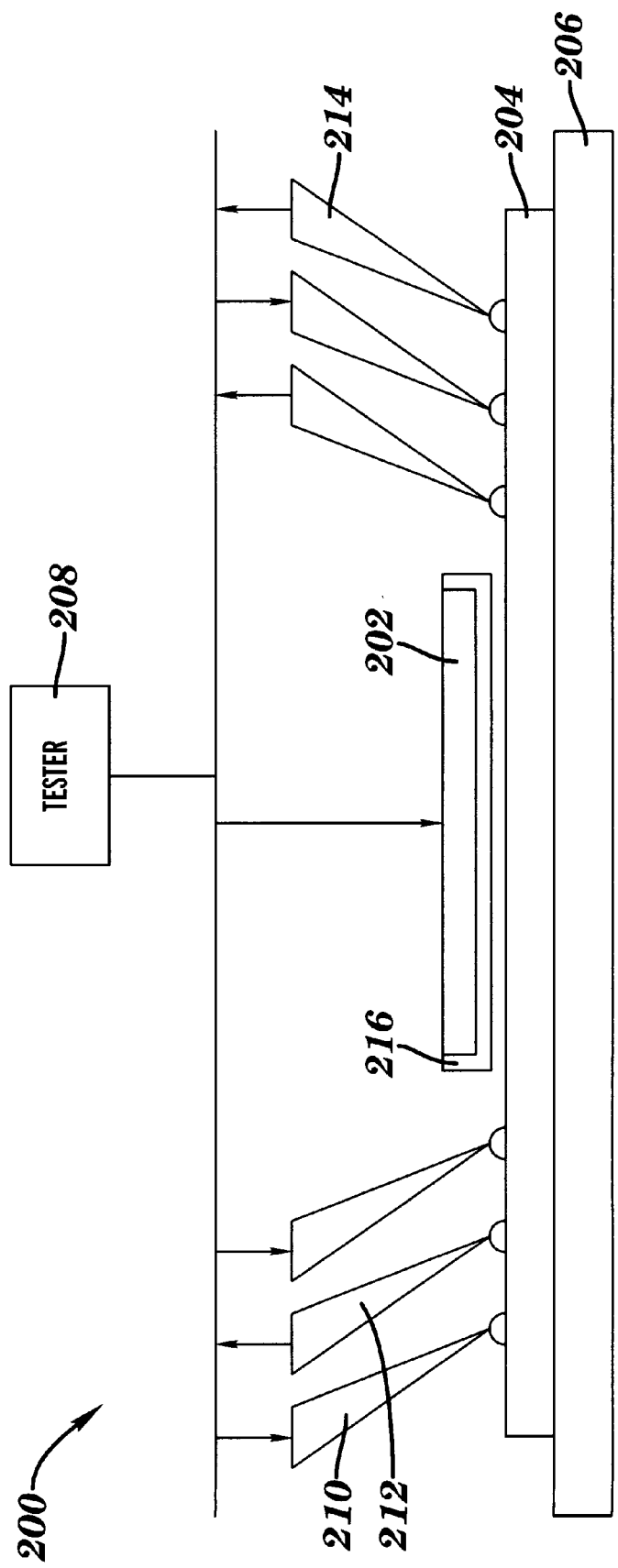
FIG. 3 schematically depicts another embodiment of the tester of the invention with the test plate positioned on the same side of a chip as cantilever probes positioned on wiring pads of an integrated circuit of the chip.

FIG. 3 shows a third embodiment 200 of the test apparatus invention of Applicants' in which plate 202 is positioned over most of the area of an integrated circuit of computer chip 204 held in place by test chuck 206 such as a vacuum chuck. While tester 208 applies a dynamically changing high potential to plate 202 to fluctuate the electronic field applied to the integrated circuit chip, the tester applies test signals through a multitude of cantilever type test probes such as probes 210 and 212 and collects test result data through another multitude of cantilever type test probes such as probe 214.

Plate 202 is electrically isolated from the integrated circuit by a dielectric layer 216 and by holding the plate slightly separated from the chip as shown and/or by a layer of passivation on the chip (not shown).

Figure 4:
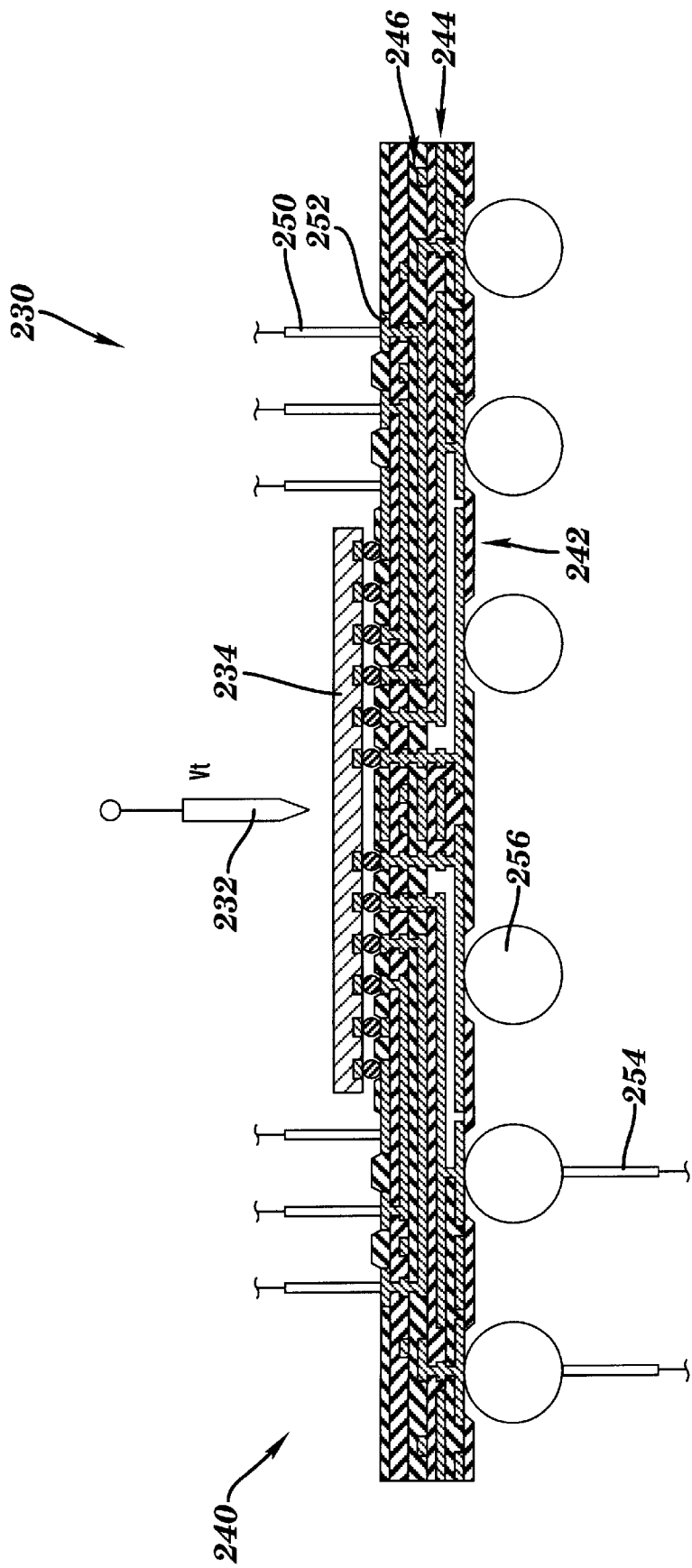
FIG. 4 schematically illustrates the test method of the invention applied to ball grid array package including a computer flip-chip connected to a ceramic or organic circuitized substrate with ball leads.

FIG. 4 shows a fourth embodiment 230 of the test apparatus of the invention in which an electrical field is generated by field probe 232 of substantially smaller area than integrated circuit chip 234. The flip-chip 234 is connected to the package substrate by controlled collapse chip connections (C4). The field probe is positioned on the side of the chip opposite from the integrated circuitry and opposite from the side of the chip that faces the package substrate, and the probe is scanned across the area of the integrated circuit while conventional testing of the chip is being performed. This allows open type defects in the integrated circuit to be localized (i.e. the approximate location of the defect in the circuit determined) during testing.

In this embodiment the testing is performed on a ball grid array (BGA) module 240 after chip 234 is attached to the module. The module may include an organic or ceramic substrate 242 with one or more wiring layers 244 separated by dielectric layers 246. The signals of a conventional test may be introduced and the test results collected through test probes 250 positioned on contacts 252 provided for such testing and/or by probes 254 positioned on balls 256 of the module.

Figure 5:
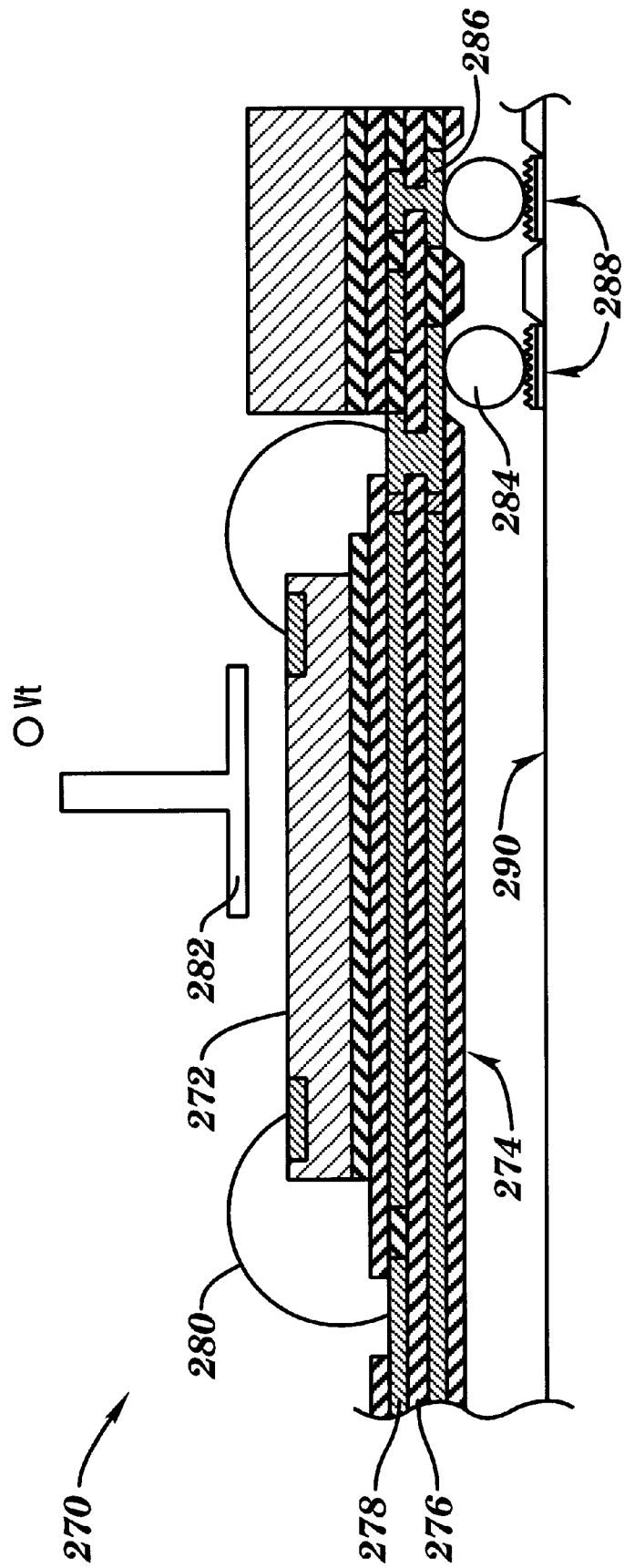
FIG. 5 schematically illustrates the test method of the invention applied to a tape ball grid array package in which a chip is wire bonded to a circuitized flexible substrate with ball leads connected to a test circuit board.

FIG. 5 shows a fifth embodiment 270 of the test apparatus of the invention for testing a tape ball grid array module (TBGA). A chip 272 is bonded to the exterior surface of flexible substrate 274 of thin polyimide film 276 and flexible patterned Cu foils 278. The chip is electrically interconnected to the wiring layers of the flexible substrate by bond wires 280 which extend between pads on the chip and pads of the tape wiring layers. An external electric field is generated by a small plate 282 which is moved across the side of a chip having the integrated circuitry while the package is being tested. The test signals and test results are transmitted through the array of package connection balls 284 attached to bottom pads 286 of the flexible substrate and through dendrite covered pads 288 on the surface 290 of a test fixture. A potential Vt, which may be at a much higher potential than the conventional test signals, is applied to the plate during testing of the package to generate the electric field.

The invention is preferably used in combination with a conventional testing method for the integrated circuit component. The invention may be more effectively used with some common testing methods than with other methods. Testing systems which are useful include current drain to drain quiescent (IDDq) testing in which current to voltage planes are measured, and current drain to source quiescent (IDSq) testing in which current from ground is measured. The conventional testing may include conventional logic testing or conventional memory testing. For example, the electric field could be applied in memory testing of SRAM, DRAM, memory (registers) embedded in processors. Slow digital testing may be used or fast performance testing at high frequencies.

Figure 6A:
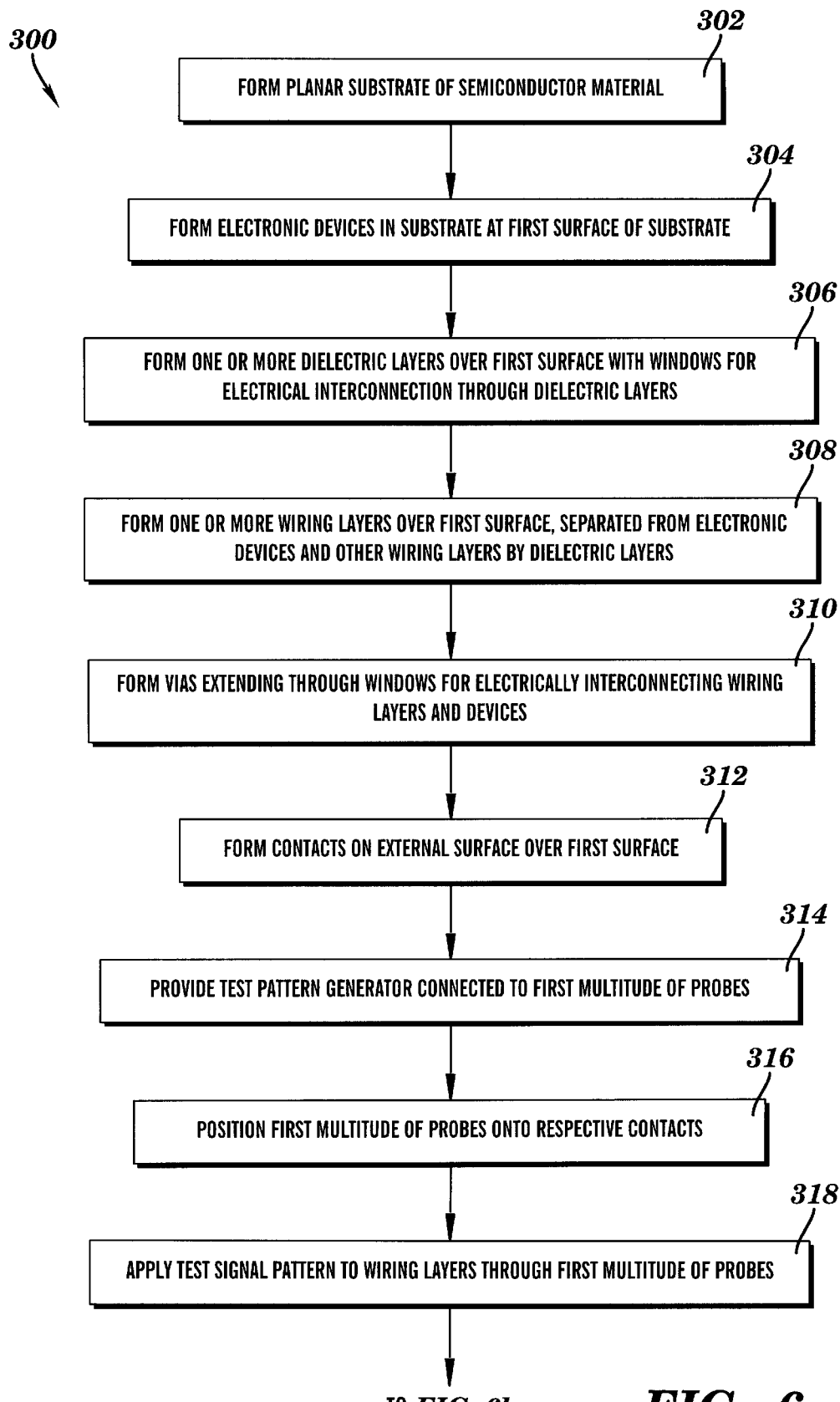
FIG. 6a–6b are flow diagrams illustrating the process for producing integrated circuits of the invention.
Figure 6B:
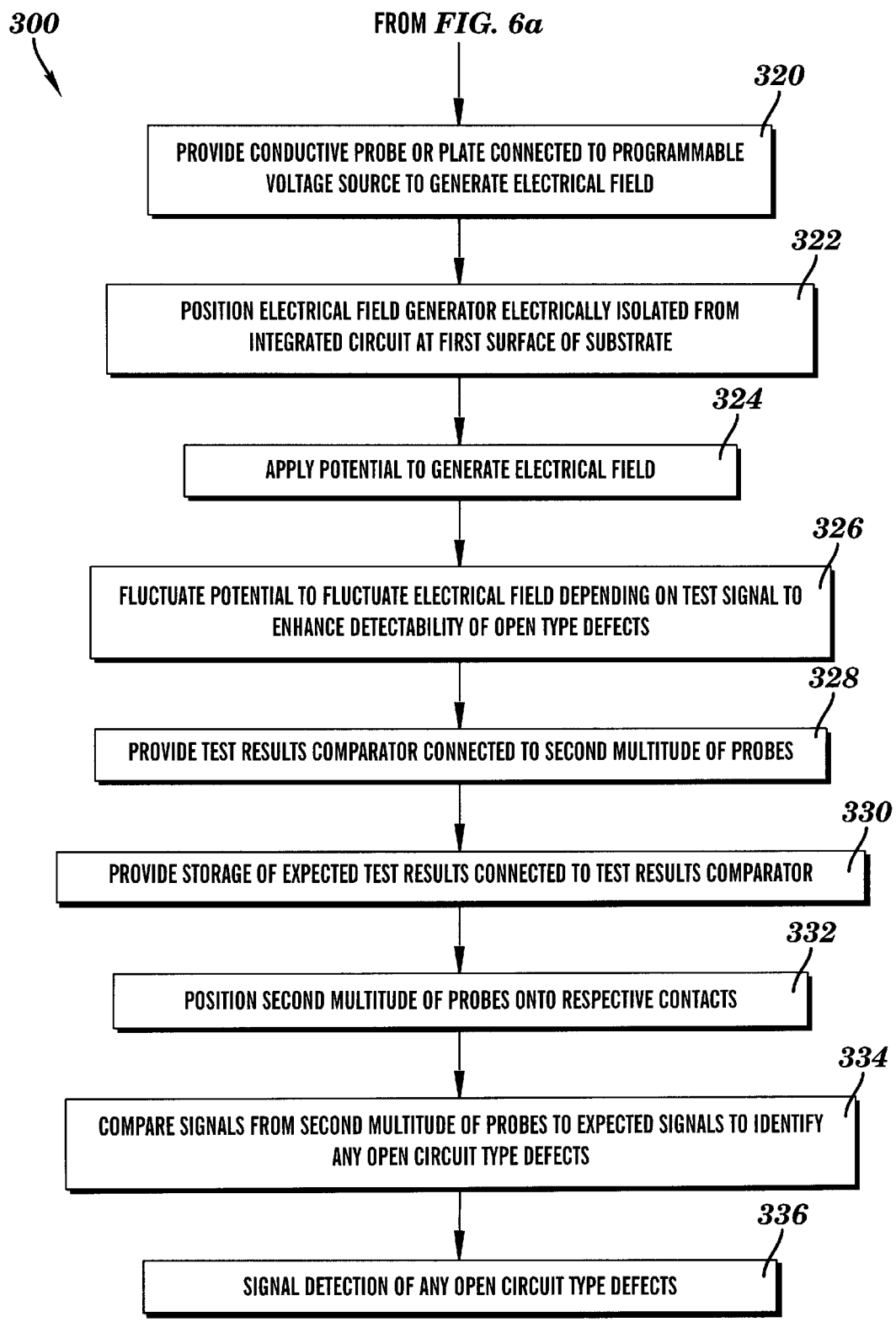

FIGS. 6a–6b is a flow diagram of an embodiment 300 of the process of the invention for testing an integrated circuit wafer or chip. Some details of the process which are discussed above with relation to other figures will not be repeated here. In step 302, a planar substrate of semiconductor material is formed. A cylindrical crystal of silicon metal may be formed by dipping and pulling a seed crystal out of a rotating crucible of molten silicon metal. Alternatively, a melted float-zone may be slowly moved through a cylinder of polycrystaline Si metal to form a single crystal. Then the cylinder may be cut by a diamond saw into thin wafers. In step 304, electronic devices are formed in the substrate at a first surface of the substrate. The details of this step are discussed above with relation to FIG. 1.

In step 306, one or more dielectric layers are formed over the first surface with windows for electrical interconnection through the dielectric layers. As discussed above with relation to FIG. 1, the first dielectric layer is usually $SiO_2$ and subsequent layers are sputtered, spin coated, or provided by CVD. The windows may be formed by depositing a photoresist over the dielectric layer, photo-developing cavities through the photoresist, etching away or solvent dissolving the dielectric under the cavities in the photoresist to form cavities in the dielectric, and then rinsing away the photoresist with a solvent.

In step 308, one or more wiring layers are formed over the first surface, separated from electronic devices and other wiring layers by the dielectric layers. The wiring layers may be produced by depositing a photoresist layer over the dielectric layer, photo-developing a wiring pattern through the photoresist, sputtering or evaporating Al onto the exposed dielectric and over the photoresist, and then rinsing away the photoresist with a solvent.

In step 310, conductive vias are formed extending through the windows of the dielectric layers for electrically interconnecting the wiring layers and devices. The vias may be formed at the same time and using the same process as forming the wiring layers.

In step 312, contacts are formed on the external surface over the first surface. Since the contacts are relatively large, they are usually formed by placing a mask over cavities in a passivation layer and depositing an Al pad at each respective cavity. Then high melting temperature solder may be deposited to form C4 bumps for flip-chip connection.

In step 314, a test pattern generator is provided and connected to first multitude of probes and in step 316, the first multitude of probes is positioned onto respective contacts. The first multitude of probes may be collapsing column type probes or cantilever type probes.

In step 318, a test signal pattern is applied to the wiring layers through the first multitude of probes. The test pattern may include any common test pattern used for any conventional electronic testing of integrated circuits and may include functional testing or burn-in.

In step 320 a conductive probe or plate is connected to a programmable voltage source. The probe may be a pointed end probe or a flat ended probe or may be a relatively small plate which produces a local electrical field, the probe or plate may then be moved across the area of the integrated circuit to obtain some additional information about the position of the open type defects. Alternatively, a fixed plate may be provided such as a plate extending parallel to the wafer and larger then the wafer to allow simultaneous testing of all the individual chip patterns of the wafer.

In step 322, the plate is positioned electrically isolated from integrated circuit across the first surface of the substrate and in step 324, a potential is applied to the plate to generate an electrical field. The potential should be as high as practical without effecting the normal operation of the integrated circuit. For a planar plate the field will be approximately perpendicular to plane of the plate except at the edges of the plate.

In step 326, the potential of the plate is fluctuated depending on test signal to enhance detectability of open type defects and in step 328, a test results comparator is connected to a second multitude of probes. The second multitude of probes may be collapsing column type probes, or cantilever type probes.

In step 330, a store of expected test results are provided. Preferably the store is an electronic computer memory which may be an independent component, or may be incorporated in the comparator or test controller.

In step 332, the second multitude of probes are positioned onto respective contacts. The first multitude of probes may be collapsing column type probes, or cantilever type probes. In step 334, test result signals from second multitude of probes are compared to expected signals to identify any potential open circuit type defects, and in step 336, the detection of any potential open circuit type defects are transmitted to a test controller.

Figure 7A:
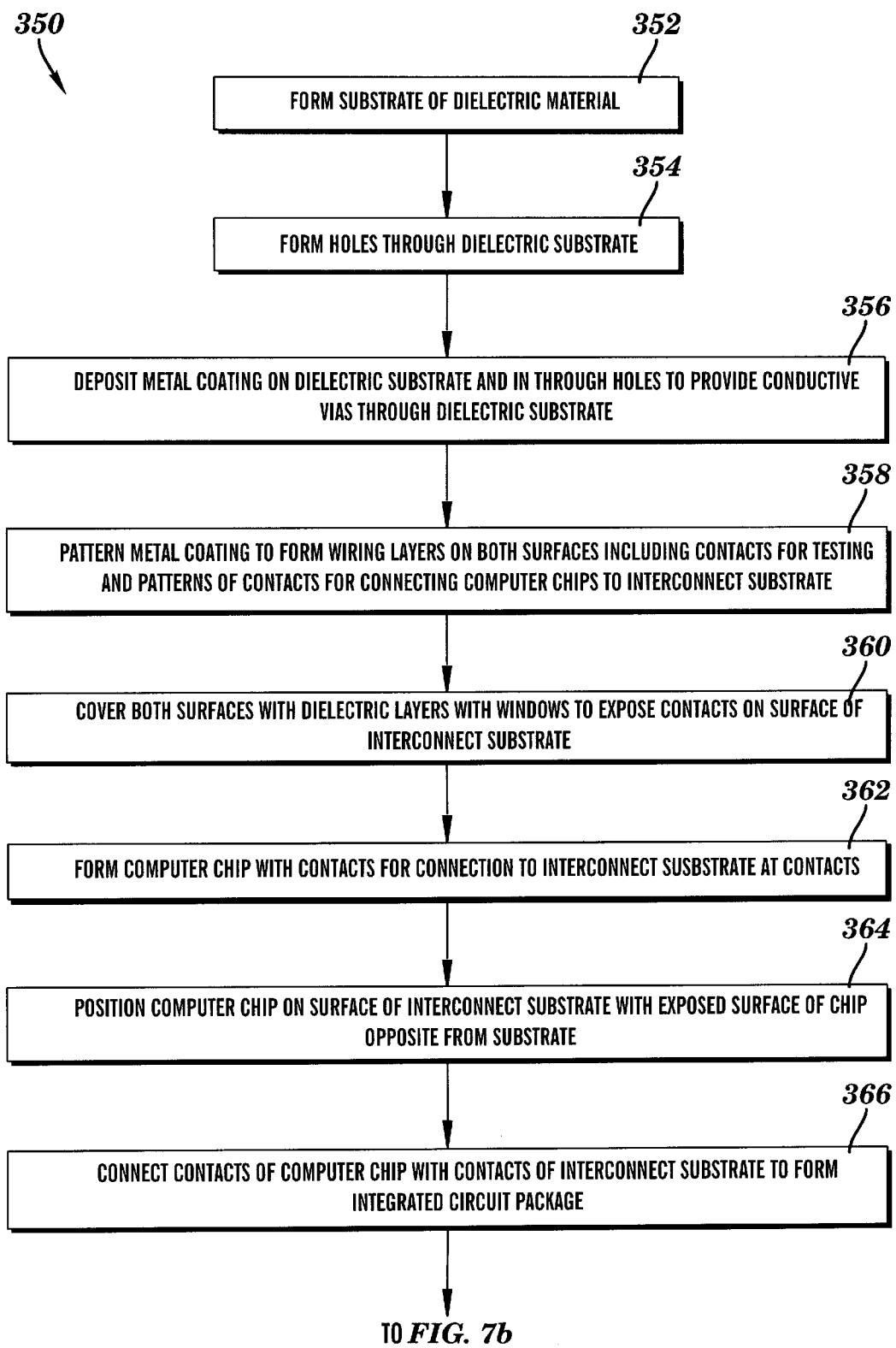
FIG. 7a–7c are flow diagrams showing the process for producing interconnect structures of the invention.
Figure 7B:
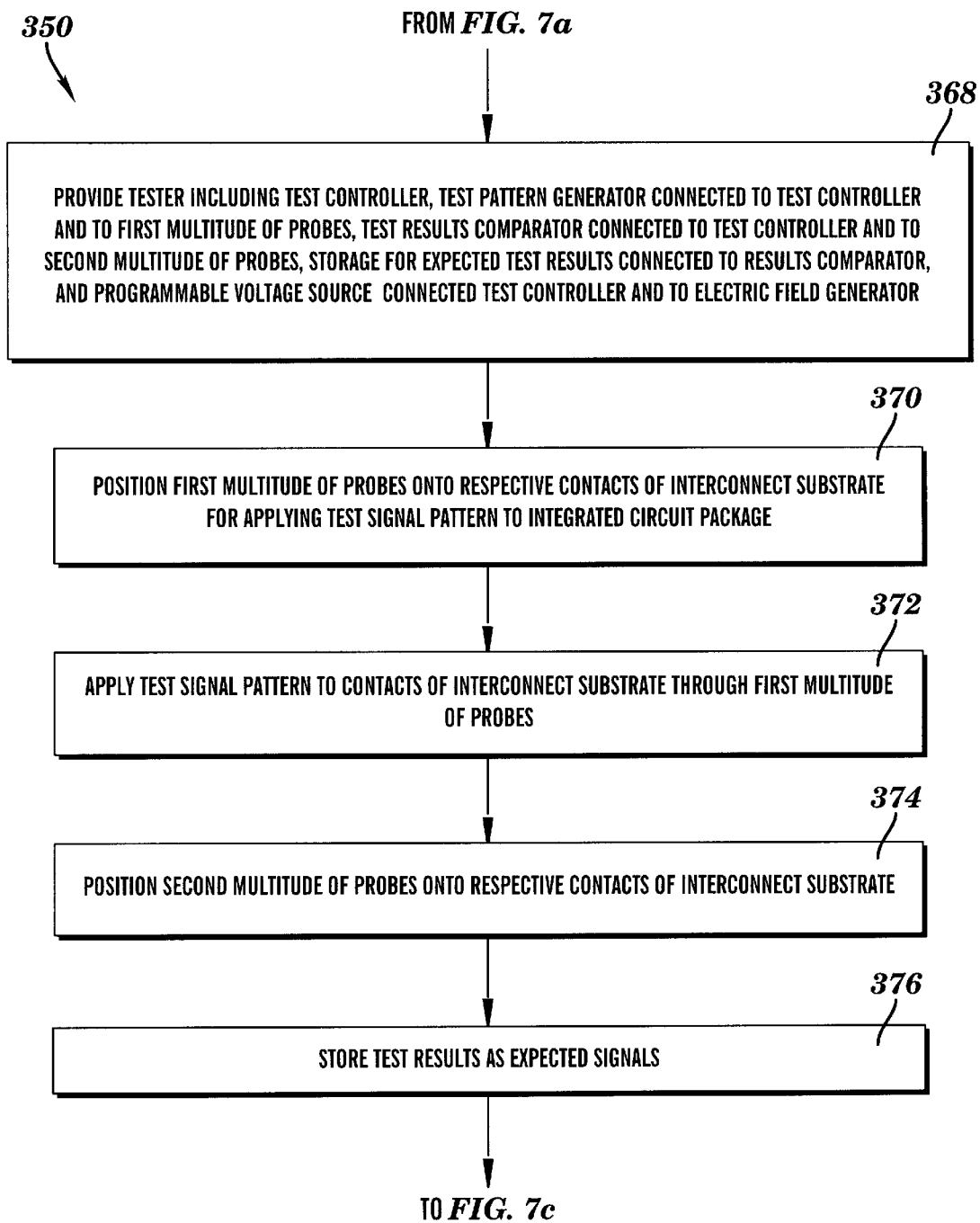
Figure 7C:
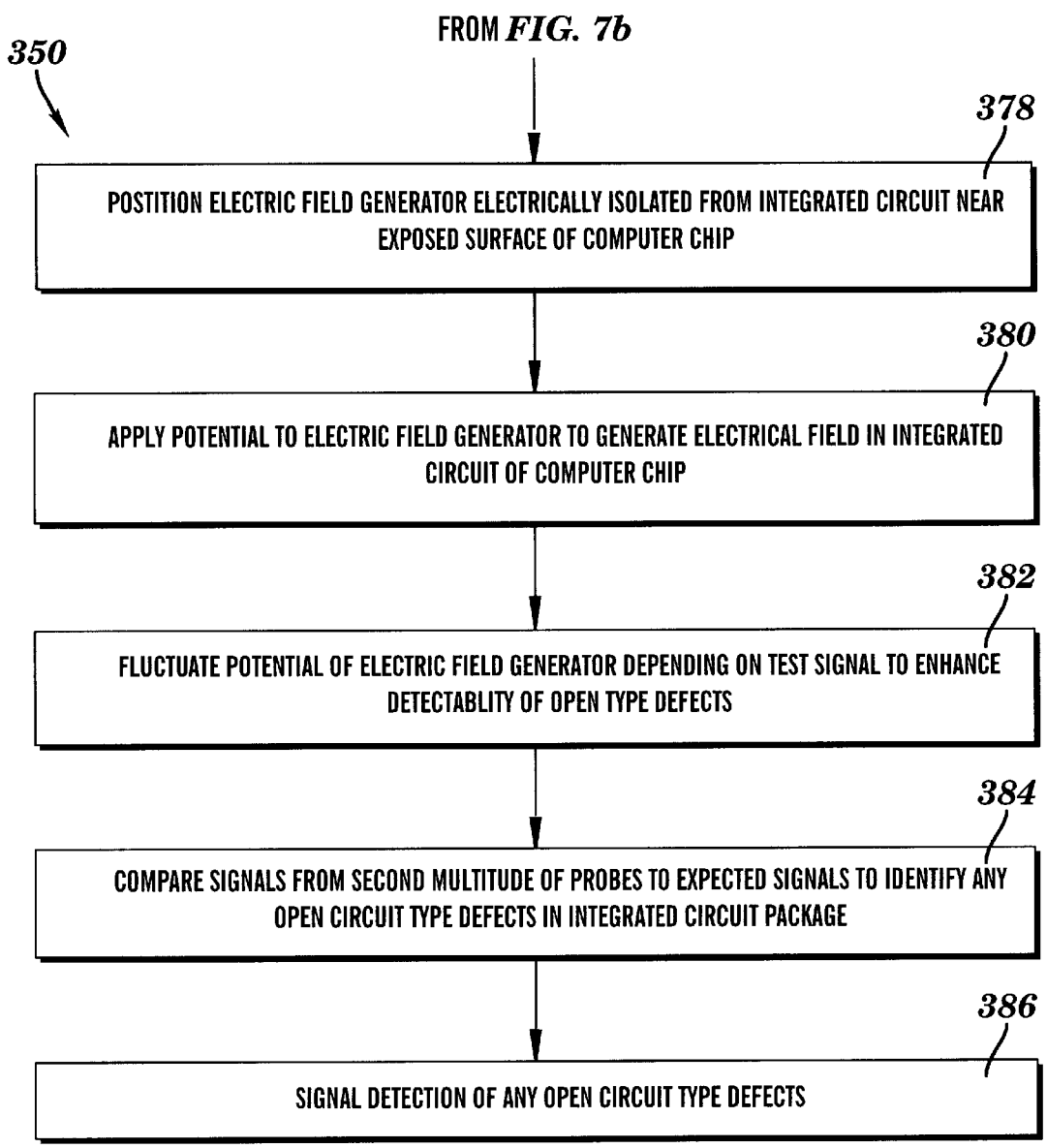

FIGS. 7a–7c show an embodiment of the process of the invention for testing a integrated circuit package.

In step 352, a substrate of dielectric material is formed. The substrate may be a greensheet for producing a ceramic substrate or a prepreg of partially cured epoxy filled with fiberglass fabric, a film of polyimide, or another polymer film which can be metalized.

In step 354, holes are formed through dielectric substrate. Holes are punched through greensheets, fiberglass epoxy is mechanically drilled, and flexible films may be laser drilled or punched.

In step 356, a metal coating is deposited on the dielectric substrate and in the through holes to provide conductive vias through the dielectric substrate. For ceramic substrates, conductive ink is screened onto the surface of the substrate. For rigid organic substrates, the metal may be plated onto the organic substrate electrolessly and then electrolytically in wet baths. For flexible film, the metal may be sputtered onto the flexible film while the film is flexed against a drum to prevent overheating the film.

In step 358, the metal coating is patterned to form wiring layers on both surfaces of the substrate including contacts for testing the package and a pattern of contacts for connecting one or more computer chips to the interconnect substrate. The substrate may be patterned after the substrate is coated with a metal film, or the pattern may be formed by the deposition process. For example, after sensitizing the surface and holes of a rigid organic substrate, a mask may be formed on the substrate by exposing and developing a photoresist, and a wiring pattern formed by electrolessly plating, then electroplating, and then stripping off the photoresist.

In step 360, both surfaces of the interconnect substrate are coated with dielectric layers with windows to expose the contacts on the surface of the interconnect substrate. The dielectric layer may be formed and then laminated to the surface, or an organic dielectric may be deposited on the surface and then holes formed by lithography. For example, a photoresist may be deposited over the dielectric layer, cavities may be formed by photo-developing cavities through the photoresist, then cavities formed through the dielectric layer by etching away or solvent dissolving the dielectric under the cavities in the photoresist to form cavities in the dielectric, and then the photoresist may be rinsed away with a solvent.

In step 362, one or more computer chips are formed with contacts for connection to the interconnect substrate at the contacts of the interconnection substrate. The formation of computer chips is discussed above with reference to FIGS. 1, 6a and 6b.

In step 362, the computer chips are positioned on the surface of the interconnect substrate with an exposed surface of chip opposite from the interconnection substrate. The back of the chip may be bonded to the substrate by soldering or adhesives.

In step 366, the contacts of the computer chip are connected with respective contacts of the interconnect substrate to form an integrated circuit package. The contacts may be connected by wire bonding in which very fine wires (1 to 3 mil) are connected between corresponding contacts of the chip and package substrate. Alternatively, flip-chip connections may be used in which an array of bumps on the surface of a flip-chip are soldered to a corresponding array of pads on the package substrate.

In step 368, a tester is provided. The tester may include several components such as a test controller for automating the testing and reporting results. A test pattern generator may be connected to the test controller and to a first multitude of probes to provide a test pattern. A test results comparator may be connected to the test controller and to a second multitude of probes to receive the test results and compare them the expected results. A storage for expected test results may be connected to the test results comparator to provide the iexpected results for the comparison. A programmable voltage source may be connected to the test controller and to an electric field generator to control the electric field applied to the integrated circuit.

In step 370, the first multitude of probes are positioned onto respective contacts on the interconnect substrate for applying a test pattern to the integrated circuit package and in step 372, a test signal pattern is applied to the contacts of the interconnect substrate through the first multitude of probes.

In step 374, the second multitude of probes is positioned onto other respective contacts of the interconnect substrate, and in step 376, the test result signals are stored as expected results in the storage for expected results.

In step 378, the electric field generator is positioned electrically isolated from computer chip near the exposed surface of the computer chip, and in step 380, a relatively high potential is applied to the electric field generator to generate an electrical field in the integrated circuit of the package. In step 382, the potential applied to the electric field generator is altered to fluctuate the electric field depending on test signal in order to enhance the detectability of floating net type or open type defects.

In step 384, the signals from second multitude of probes are compared to the expected signals to identify any open circuit type defects and in step 386, detection of any open circuit type defects is signaled to the test controller.

The invention has been described with reference to specific embodiments including the best mode for carrying out the invention, and with sufficient detail that anyone skilled in the art can utilize the invention. Those skilled in the art may modify these embodiments within the spirit of the invention, and thus, the description does not limit the present invention to the disclosed embodiments. The invention is limited only by the following appended claims.

We claim:

1. An integrated circuit testing system comprising:

a planar integrated circuit having a wiring layer on a first side thereof;

a system for applying an electric field to the integrated circuit;

a system for measuring potentials in at least one location in the wiring layer; and a system for identifying any open circuit type defects within the integrated circuit including a system for comparing the measured potentials with an expected potential.

2. The system of claim 1, further comprising a chuck to hold the integrated circuit in a fixed position.

3. The system of claim 1, wherein the system for applying the electric field is positioned proximate the first side of the integrated circuit and comprises:

a probe, wherein the probe is movable with respect to the integrated circuit and is electrically isolated from the integrated circuit.

4. The system of claim 1, wherein the system for measuring potentials comprises a plurality of buckling beam test probes for connection to pads of the wiring layers on the first side of the integrated circuit.

5. The device of claim 1, wherein the system for measuring potentials comprises a plurality of cantilever test probes for connection to contact bumps of the wiring layers on the first side of the integrated circuit.

6. The system of claim 1, further comprising:

a test pattern generator connected to a first multitude of test probes to provide test signals to the integrated circuit;

storage for expected test results;

a comparator connected to a second multitude of test probes to compare test results with the expected test results and to generate a signal dependent on the comparison.

7. The system of claim 6, wherein the system for applying the electric field to the integrated circuit comprises:

a conductive plate approximately coplanar to at least a portion of one side of the integrated circuit and electrically isolated from the integrated circuit; and a system for applying selected potentials to the plate.

8. The system of claim 7, wherein the system for applying selected potential includes a system for dynamically varying the potential applied to the plate in order to maximize detectability of open circuit type defects.

9. The system of claim 8, wherein the system for dynamically varying the potential applied to the plate includes:

a programmable voltage source; and a system for providing a potential that is substantially higher than the test signals.

10. An integrated circuit test system, comprising:

a multi-layer integrated circuit, having at least one wiring layer and at least one dielectric layer;

a system for applying an electric field to the integrated circuit; and a system for detecting open circuit type defects occurring within the multi-layer integrated circuit.

11. The system of claim 10, wherein the system for detecting open circuit type defects within the integrated circuit comprises:

a system for measuring potentials in the at least one wiring layer; and a system for comparing the measured potentials with expected potentials.

12. The system of claim 10, wherein the system for detecting open circuit type defects comprises:

a test pattern generator connected to a first test probe to provide test signals to the integrated circuit;

storage for expected results; and a comparator connected to a second test probe to compare test results with the expected test results and to generate a signal dependent on the comparison.

* * * * *